(12) United States Patent
Fujimaru et al.

(10) Patent No.: US 6,783,828 B2
(45) Date of Patent: Aug. 31, 2004

(54) RESIN COMPOSITION, ADHESIVE FILM FOR SEMICONDUCTOR DEVICE, AND LAMINATED FILM WITH METALLIC FOIL AND SEMICONDUCTOR DEVICE USING THE SAME

(75) Inventors: Koichi Fujimaru, Otsu (JP); Toshio Yoshimura, Fukuoka (JP); Nobuo Matsumura, Kusatsu (JP)

(73) Assignee: Toray Industries Inc., Tokyo (JP)

( * ) Notice: Subject to any disclaimer, the term of this patent is extended or adjusted under 35 U.S.C. 154(b) by 104 days.

(21) Appl. No.: 10/188,134

(22) Filed: Jul. 3, 2002

(65) Prior Publication Data

US 2003/0035948 A1 Feb. 20, 2003

(30) Foreign Application Priority Data

Jul. 6, 2001 (JP) ........................................ 2001-206071

(51) Int. Cl.$^7$ ..................... C08L 77/06; H01L 23/495; B32B 19/02
(52) U.S. Cl. ..................... 428/40.1; 428/343; 428/328; 428/329; 428/330; 428/354; 428/355 CN; 428/355 EP; 428/355 EN; 428/402; 428/474.4
(58) Field of Search ................................. 428/40.1, 343, 428/354, 355 CN, 355 EP, 355 EN, 402, 474.4, 328, 329, 330

(56) References Cited

U.S. PATENT DOCUMENTS

| 4,387,184 A | 6/1983 | Coquard et al. |
| 5,376,712 A | 12/1994 | Nakajima |
| 5,945,188 A | 8/1999 | Sei et al. |

FOREIGN PATENT DOCUMENTS

| EP | 0 357 065 | 3/1990 |
| EP | 0 865 905 | 9/1998 |

*Primary Examiner*—Daniel Zirker
(74) *Attorney, Agent, or Firm*—Morrison & Foerster LLP

(57) ABSTRACT

A resin composition has a phase separation structure having at least two phases and inorganic particles having a mean primary particle size of 0.1 μm or less. The phase separation structure includes a matrix phase and a disperse phase. The inorganic particles are mainly present in any one of the matrix phase, the disperse phase, and the interface between the matrix phase and the disperse phase. The resin composition has a high thermal expansion coefficient and elastic modulus, and thus provides an adhesive for semiconductor devices which has excellent reflow resistance and adhesion.

12 Claims, 6 Drawing Sheets

2 μm

2 μm

2 μm

2μm

2 μm

Figure 1:
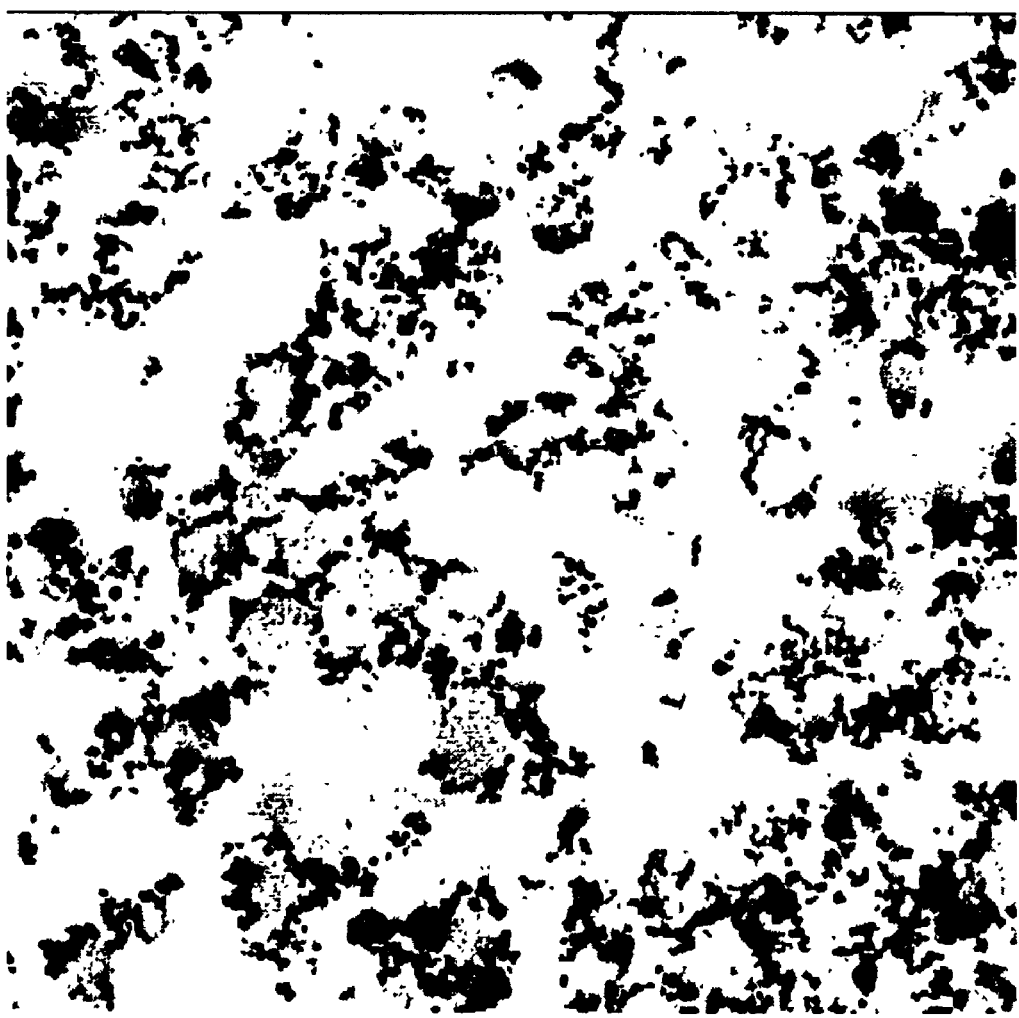

RESIN COMPOSITION, ADHESIVE FILM FOR SEMICONDUCTOR DEVICE, AND LAMINATED FILM WITH METALLIC FOIL AND SEMICONDUCTOR DEVICE USING THE SAME

BACKGROUND OF THE INVENTION

1. Field of the Invention

The present invention relates to resin compositions and particularly to resin compositions used for semiconductor devices, which must have excellent electrical and mechanical characteristics. Specifically, the present invention relates to an adhesive used for semiconductor devices. More specifically, the present invention relates to an adhesive film used in tape automated bonding (TAB), which is a method for packaging semiconductor devices, to an adhesive sheet used for bonding semiconductor integrated circuits to an interposer, which is a substrate for connecting semiconductor integrated circuits, in order to package the circuits by wire bonding, and to a semiconductor device using the adhesive film and sheet.

2. Description of the Related Art

In general, as ambient temperature increases, resin molecules become active, so that the length and the volume of the resin increase and the elastic modulus deteriorates. Resin compositions whose size and elastic modulus easily change, traditionally, cannot be used in high-precision processing. Also, when a resin composition laminated with a different material, such as, metals or ceramics, is subjected to, for example, a heat cycle test in which heating and cooling are repeated, the difference between the thermal expansion coefficients of the resin composition and the different materials causes an internal stress and degrades elasticity. As a result, the adhesion between the laminated layers is degraded and, in some cases, delamination occurs. In addition, resin compositions used as adhesives for semiconductor devices are required to have sufficient adhesion even under conditions during the heat cycle test and reflow soldering.

It is known that degrading the elastic modulus of the resin compositions increases the adhesion of the resin compositions. However, this leads to an increased thermal expansion coefficient and the elastic modulus is significantly reduced at high temperature. As a result, the adhesion is degraded and the solder reflow resistance is poor.

On the other hand, in order to reduce the thermal expansion coefficient and to increase the elastic modulus of the resin compositions, the cross-linking density of the resin compositions is increased or a hard structure, such as benzene ring, is introduced. These methods are effective to increase the elastic modulus but do not sufficiently reduce the thermal expansion coefficient. As a result, shrinkage on curing of the resin compositions increase internal stress and the increased elastic modulus easily causes brittle fracture to occur in the adhesive resin composition. Thus, the adhesion of the resin compositions is degraded. Also, in another method, glass fiber, inorganic particles of silicon oxide, or the like are added to a resin material whose elastic modulus is low at room temperature to reduce the thermal expansion coefficient and to increase the elastic modulus at high temperature of the resin composition. However, in this instance, a large amount of inorganic component have to be added, and consequently the proportion of organic components is relatively reduced, so that the resulting resin composition becomes brittle and the adhesion of the resin composition is significantly degraded.

FIGS. 1–6 are TEM pictures of resin composition showing a matrix phase and a disperse phase. The TEM pictures include the magnification scale.

SUMMARY OF THE INVENTION

Accordingly, an object of the present invention is to provide a highly adhesive resin composition having a high solder-reflow resistance, a low thermal expansion coefficient, and a high elastic modulus.

The present invention is directed to a resin composition comprising: a phase separation structure having at least two phases; and inorganic particles having a mean primary particle size of 0.1 $\mu$m or less.

The content of the inorganic particles may be in the range of 5 to 50 weight percent.

Preferably, the phase separation structure comprises a matrix phase and a disperse phase.

Preferably, the inorganic particles are mainly present in either the matrix phase or the disperse phase.

Alternatively, the inorganic particles may be mainly present in the interface between the matrix phase and the disperse phase.

Preferably, at least one of the matrix phase and the disperse phase forms a chain structure.

Preferably, the area ratio of the matrix phase is in the range of 50 to 95 and the area ratio of the disperse phase is in the range of 5 to 50.

Preferably, the elastic modulus of the resin composition after being cured is 25 MPa or more at a temperature of 150° C.

Preferably, the ratio of the elastic modulus of the resin composition at 30° C. to the elastic modulus at 150° C. is 30 or less.

The present invention is also directed to an adhesive film for semiconductor devices. The adhesive film comprises an organic insulating layer and an adhesive layer formed on a surface of the organic insulating layer. The adhesive layer comprises the resin composition described above.

The adhesive film may further comprise a protective layer capable of being peeled.

The present invention is also directed to a metallic foil-laminated film comprising the above-described adhesive film and a metallic foil laminated on the adhesive layer of the adhesive film.

The present invention is also directed to a semiconductor device comprising the metallic foil-laminated film.

By using the resin composition of the present invention, which has a low thermal expansion coefficient and a high elastic modulus, as an adhesive for semiconductor devices, a semiconductor device including an adhesive layer having excellent reflow soldering resistance and adhesion can be achieved.

DESCRIPTION OF THE PREFERRED EMBODIMENTS

A resin composition of the present invention has a phase separation structure between at least two phases and contains inorganic particles having a mean primary particle size of 0.1 $\mu$m or less.

The inorganic particles are not limited to being spherical but may be elliptical, flake, rod-like, or fibrous. The mean primary particle size of the inorganic particles is 0.1 $\mu$m or less and preferably in the range of 1 nm to 0.08 $\mu$m. A mean primary particle size larger than 0.1 μm makes it difficult to reduce the thermal expansion coefficient of the resin composition and to increase the elastic modulus. The mean primary particle size here means the highest frequency in the particle size distribution of the inorganic particles when they exist independently. The mean primary particle size also represents the diameter of the particles when they are spherical and the maximum length when they are elliptical or flat. When the particles are rod-like or fibrous, the mean primary particle size represents the maximum length in the longitudinal direction of the particles. The mean primary particle size of inorganic particle powder can be measured by a laser diffraction/scattering method or a dynamic light scattering method. However, the measuring method needs to be appropriately selected depending on the particle shape, the method for preparing the particles, the medium for dispersing the particles, and the method for dispersing the inorganic particles.

The content of the inorganic particles is in the range of 5 to 50 weight percent relative to the solid contents in the resin composition and preferably in the range of 7 to 30 weight percent. A content of the inorganic particles smaller than 5 weight percent makes it difficult to reduce the thermal expansion coefficient of resin composition and to increase the elastic modulus. A content of the inorganic particles more than 50 weight percent gradually degrades the adhesion of the resin composition.

Any inorganic particles including ceramics may be used in the present invention. Exemplary ceramic particles include simple ceramic powder, powder mixture of glass and ceramics, and crystallized glass.

Simple ceramic powder includes alumina ($Al_2O_3$), zirconia ($ZrO_2$), magnesia (MgO), beryllia (BeO), mullite ($3Al_2O_3.2SiO_2$), cordierite ($5SiO_2.2Al_2O_3.2MgO$), spinel ($MgO.Al_2O_3$), forsterite ($2MgO.SiO_2$), anorthite ($CaO.Al_2O_3.2SiO_2$), celsian ($BaO.Al_2O_3.2SiO_2$), silica ($SiO_2$), enstatite ($MgO.SiO_2$), and aluminium nitride (AlN). Preferably, the purity of these ceramic powders is 90 weight percent or more. When aluminium nitride powder is used, 0.5 to 20 weight percent of calcium additives, such as $CaC_2$, $CaVO_3$, $CaCN_2$, $CaF_2$, and CaO, or of yttrium additives, such as $Y_2O_3$, may be added to the powder. Powder mixtures may be added which contain: 0.01 to 15 weight percent, on a metal element basis, of additives including yttrium, rare-earth metals, alkaline-earth metals, and carbon; 1 to 5 weight percent of carbides, such as $MgC_2$, ZrC, VC, and NbC; or oxides, such as BeO. A preferred content of additives is 1 to 10 weight percent of $Y_2O_3$ and BeO, 1 to 5 weight percent of calcium oxide, or 1 weight percent or less of carbon. A single additive or a mixture of two or more additives may be used.

The powder mixture of glass and ceramics is, for example, a glass composition powder containing $SiO_2$, $Al_2O_3$, CaO, or $B_2O_3$, and if necessary, MgO, $TiO_2$, or the like. Specifically, the powder mixture of glass and ceramics contains $SiO_2$—$B_2O_3$ glass, PbO—$SiO_2$—$Al_2O_3$—$B_2O_3$ glass, CaO—$SiO_2$—$Al_2O_3$—$B_2O_3$ glass, or the like and at least one ceramic component selected from the group consisting of alumina, zirconia, magnesia, beryllia, mullite, cordierite, spinel, forsterite, anorthite, celsian, silica, and aluminium nitride.

The crystallized glass is, for example, MgO—$Al_2O_3$—$SiO_2$ and $Li_2O$—$Al_2O_3$—$SiO_2$ crystallized glass. The crystallized glass is prepared such that, for example, $B_2O_3$ and a nucleating material are added to MgO—$Al_2O_3$—$SiO_2$ glass, followed by being calcined at a temperature of 900 to 1000° C. to separate out cordierite crystals to increase the strength thereof, or such that a nucleating material is added to $LiO_2$—$Al_2O_3$—$SiO_2$ glass, followed by separating out spodumene to increase the strength thereof.

Diatomite, zinc oxide, calcium carbonate, mica, fluorocarbon resin powder, diamond powder, and the like may be used as the inorganic particles.

The inorganic particles may be subjected to surface treatment, if necessary. Exemplary surface treatments include water-repellent treatment using silicone oil or the like, hydrophobic treatment or hydrophilic treatment using silane coupling agent or the like, and introduction of or an organic functional group, such as a hydroxyl group, an amino group, a carboxyl group, an epoxy group, an acrylic group, a vinyl group, an alkyl group, or an aryl group. The surface treatment is appropriately selected to improve affinity with the resin composition, cohesion in the interface between the inorganic particles and resin composition, dispersion or the like.

The phase separation structure in the present invention means that a plurality of phases is present in organic components of the resin composition and the conformation of phases may have disperse/matrix phases, a lattice laminate structure (lamella-like structure), or others. Preferably, the phase separation structure has a matrix phase and a disperse phase. The matrix phase refers to the main phase in the phase separation structure of a cured resin composition. The disperse phase refers to a phase in the matrix phase, and may have any shape including a sphere, cylinder-like shape, and indefinite shape. Preferably, a plurality of disperse phases forms a chain structure. In the chain structure of the disperse phase, two or more independent disperse phases are linked and form any one of a linear, a comb, an dendritic, and an asteriated structure to form a higher order network structure.

Preferably, the area proportions of the matrix phase and the disperse phases are in the range of 50 to 95% and in the range of 5 to 50%, respectively.

Preferably, the content of the inorganic particles in the resin composition is in the range of 5 to 50 weight percent. Preferably, the inorganic particles are mainly present in either the matrix phase or the disperse phases, but not present in both phases uniformly. The inorganic particles may be mainly present in the interfaces between the matrix phase and the disperse phases, and preferably they are mainly present in the vicinity of the interfaces in the matrix phase. Still more preferably, the disperse phases form a chain structure in which at least two disperse phases are linked and the inorganic particles are mainly present in the vicinity of the interfaces between the matrix phase and the disperse phases in the matrix phases, or the disperse phases form the chain structure in which at least two disperse phases are linked and the inorganic particles are mainly present in the disperse phases.

The area ratio of the matrix phase to the disperse phases, the formation of a higher order chain structure, and the state of the inorganic particles in the phase separation structure may be determined according to the components in the resin composition and the method for dispersing the inorganic particles.

The matrix/disperse phase separation structure, the dispersion of the inorganic particles, the state and higher order chain structure of the disperse phases are observed by transmission electron microscopy (TEM) in which the resin composition is stained with osmic acid, ruthenium oxide, phosphotungstic acid, or the like, if necessary. The area ratio of the matrix phase to the disperse phases is observed by, for example, image analysis of a TEM photograph. In order to measure the area ratio of the matrix phase and the disperse phases, a transparent film having a uniform thickness and specific gravity may be superposed on the TEM photograph and the areas of the disperse phases are copied on the film, followed by being cut out and being weighed.

Preferably, the elastic modulus of the resin composition after being cured is 25 MPa or more at 150° C. Preferably, the elastic modulus ratio at 30° C. to 150° C. ((elastic modulus at 30° C.)/(elastic modulus at 150° C.)) is 30 or less. In the best state of the resin composition, the elastic modulus is 25 MPa or more and the elastic modulus ratio at 30° C. to 150° C. is 30 or less. If the elastic modulus is less than 25 MPa at 150° C., heat generated by a bonding device softens the adhesive layer of the adhesive film formed of the resin composition, consequently creating a hollow in a wiring pattern or causing an adhesion failure between a wire or chip and the wiring pattern. If the elastic modulus ratio at 30° C. to 150° C. is more than 30, a warp is liable to occur in the adhesive film.

More preferably, the elastic modulus is 50 MPa or more and still more preferably 80 MPa or more. Also, more preferably, the elastic modulus ratio at 30° C. to 150° C. is 20 or less and still more preferably 10 or less.

The resin composition having the above-described characteristics has not been known yet. By adding a small amount of inorganic particles to the resin composition, a reduced thermal expansion coefficient and an increased elastic modulus can be achieved, and the resulting resin composition can be highly adhesive. It is considered that the inorganic particles concentrated in the interfaces between the matrix phase and the disperse phases and existing in the disperse phases allow the disperse phases to form a higher order chain structure so that the longitudinal expansion and the volumetric expansion of the resin composition at heating and cooling are reduced and thus the thermal expansion coefficient is reduced. Also, it is considered that the higher order chain structure inhibits the fluidization of the resin composition and thus the elastic modulus is increased at high temperature.

The resin composition of the present invention having the phase separation structure contains a plurality of resin components including thermoplastic resin or thermosetting resin.

The thermoplastic resin used in the present invention includes polyolefin such as polyethylene, polypropylene, and ethylene copolymers, styrene resins such as polystyrene and ABS resin, polyvinyl chloride, vinylidene chloride, polyethylene terephthalate, polyethylene naphthalate, polybutylene terephthalate, polyacrylate resin, polyoxybenzoyl, polycarbonate, polyacetal, polyphenylene ether, and polyimide, and it is not limited to those as long as it has plasticity at temperatures in the range of 80 to 200° C. Preferably, polyamide resins are used in view of stability at high temperature and electrical characteristics. More preferably, a flexible, less water-absorptive polyamide containing dicarboxylic acid having a carbon number of 36 (so-called dimer acid) is used. In general, polyamide resins containing dimmer acid are prepared in the usual process by polycondensation of dimer acid and diamine. At the same time, a dicarboxylic acid, such as adipic acid, azelaic acid, or sebacic acid, may be added as a copolymerization component. The diamine includes ethylenediamine, hexamethylenediamine, and piperazine. From the viewpoint of hygroscopicity and solubility, two or more diamines may be mixed.

Preferably, the content of the thermoplastic resin in the resin composition is in the range of 1 to 90 weight percent. If the content of the thermoplastic resin is less than 1 weight percent, the resulting resin composition does not become flexible, and when it is used as the adhesive layer of an adhesive film for semiconductor devices, a fracture can occur in the adhesive layer. If the content is more than 90 weight percent, the resulting resin composition becomes too flexible to bear a load when semiconductor chips are mounted. Consequently, a large hollow is created in the adhesive layer and thus adhesion failure occurs. Preferably, the content of the thermoplastic resin is in the range of 20 to 70 weight percent.

The thermosetting resin used in the present invention includes phenol novolac epoxy compounds; cresol novolac epoxy compounds; bisphenol A epoxy compounds; bisphenol F epoxy compounds; bisphenol S epoxy compounds; epoxy compounds derived from a thiodiphenol, phenol, or naphthol aralkyl resin having a xylylene bridge; epoxy compounds derived from a phenol-dicyclopentadiene resin; alicyclic epoxy compounds; heterocyclic epoxy compounds; glycidyl ester epoxy compounds produced by reaction of a polybasic acid, such as phthalic acid or dimmer acid, with epichlorohydrin; glycidilamine epoxy compounds produced by reaction of a polyamine, such as diaminodiphenylmethane, diaminodiphenylsulfone, or isocyanuric acid, with epichlorohydrin; brominated epoxy compounds; and epoxy compounds having a cyclohexene oxide structure, such as $\epsilon$-caprolactone denaturated 3,4-epoxycyclohexylmethyl-3',4'-epoxycyclohexane carboxylate, trimethylcaprolactone denaturated 3,4-epoxycyclohexylmethyl-3',4'-epoxycyclohexane carboxylate, or $\beta$-methyl-$\delta$-valerolactone denaturated 3,4-epoxycyclohexylmethyl-3',4'-epoxycyclohexane carboxylate. In addition, organopolysiloxane having a glycidyl group and silicone-denaturated epoxy compounds produced by reaction of the above-described epoxy compounds with organosiloxane having a carboxyl group may be sued. At least two compounds of the epoxy compounds and the silicone-denaturated epoxy compounds may be combined.

Preferably, in addition to the epoxy resin, the thermosetting resin contains a curing agent capable of reacting with epoxy resin. Exemplary curing agents include polyamines, such as diethylenetriamine, triethylenetetramine, m-xylenediamine, and diaminodiphenylmethane; polyamides, such as polyamide dimmer; anhydrides, such as phthalic anhydride, methyltetrahydrophthalic anhydride, hexahydrophthalic anhydride, trimellitic anhydride, and methyl nadic anhydride; 3-aminophenol; resorcinol; catechol; hydroquinone; pyrogallol; 3-hydroxybenzoic acid; 3-cyanophenol; 2,3-diaminophenol; 2-amino-3-hydroxybenzoic acid; 3-hydroxyphenylacetamide; 3-hydroxyisophthalic acid; 3-hydroxyphenylacetic acid; 3-phenolsulfonic acid; phenolic resins, such as phenol novolac, phenol aralkyl, bisphenol A, and bisphenol F; resol-type phenol resin; tertiary amines, such as polymercaptan, 2-ethyl-4-methylimidazole, and tris (dimethylaminomethyl)phenol; and Lewis acid complexes, such as boron trifluoride ethylamine complex, but the curing agents are not limited to these.

Preferably, phenol resins are used as a curing agent for the thermosetting resins and the epoxy resins. Phenol resins are compatible with polyamides, and serve as a suitable blending material to give the polyamides adequate thermal resistance and disruptive strength when the polyamides are set. The thermal resistance and the disruptive strength are important to the balance between the insulation resistance and the adhesion of the resin composition.

The content of the thermosetting resin in the resin composition which results in the adhesive layer of the adhesive film is in the range of 0.1 to 80 weight percent and preferably in the range of 20 to 70 weight percent. A thermosetting resin content less than 0.1 weight percent reduces the thermal resistance of the adhesive layer and a thermosetting resin content more than 80 weight percent degrades the flexibility of the adhesive layer, and consequently, a fracture occurs in the adhesive layer. Also, a curing accelerator may be added. For example, known accelerators including aromatic polyamine, boron trifluoride amine complexes, such as boron trifluoride triethylamine complex, imidazole derivatives, such as 2-alkyl-4-methylimidazole and 2-phenyl-4-alkylimidazole, organic acid, such as phthalic anhydride and trimellitic anhydride, dicyandiamide, and triphenylphosphine may be used. Preferably, the content of the curing accelerator is 10 weight percent or less in the adhesive layer.

In addition, an organic or inorganic substance, such as an antioxidant or an ion scavenger, may be added unless it degrades the adhesion of the adhesive layer.

The resin composition of the present invention may be used for resin substrates, fibers, undrawn films, drawn films, hot pressing materials, multi layer substrate, metallic foil-laminated substrates, paints, adhesives, and the like. In particular, the resin composition is advantageously used as an adhesive for semiconductor devices because it is highly insulative. Specifically, the resin composition is used for multi layer substrate, adhesive films, adhesive sheets for bonding semiconductors and wiring boards, and metallic foil-laminated substrates.

A protective layer may be formed on an adhesive layer of the adhesive film of the present invention to prevent the adhesive layer from being contaminated by dust, oil, water, and the like. The protective layer also improves the workability when the resin composition is formed into a very thin film. The protective layer may be a polyester or polyolefin film coated with silicone or a fluorine compound or a paper laminated with this polyester or polyolefin, and the protective layer is not limited to these as long as it is capable of being peeled without damaging the resin composition. When protective layers are provided on both surfaces of the resin composition, preferably, the peeling resistance of one protective layer is different from that of the other protective layer. The thickness of the protective layer may arbitrarily be selected, and preferably it is in the range of 10 to 125 $\mu$m.

The manufacturing process of the adhesive film and the metallic foil-laminated film for semiconductor devices will now be described. The shape of the adhesive film and the laminate film are not limited and may be tape-like or sheet-like. The adhesive film and the metal-laminated film have a substrate with a thickness of 20 to 125 $\mu$m formed of a plastic, such as polyimide, polyester, poly(phenylene sulfide), polyether sulfone, poly(ether-ether-ketone), aramid, polycarbonate, or polyacrylate, or of a composite material, such as glass cloth impregnated with an epoxy resin. The substrate may be formed by laminating a plurality of films selected from these. The substrate may be subjected to surface treatment, such as hydrolysis, corona discharge, cold plasma, physical roughening, and easy-adhesive coating, if necessary. Also, when the stiffness of the substrate is too low to be treated, a stiff film or the like capable of being peeled in a later process may be laminated on the rear surface of the substrate.

The inorganic particles may be mixed into the resin composition using a kneader or the like. Alternatively, an inorganic particle paste or slurry composed of the inorganic particles and a solvent or of the inorganic particles, a solvent, and a resin component may be prepared with a roll mill, a ball mill, or the like and be subsequently mixed with a necessary resin component.

In a mixing process, for example, the inorganic particles, a resin component, and a solvent are mixed. The solvent is capable of dissolving the resins used, and is, for example, methyl cellosolve, butyl cellosolve, methyl ethyl ketone, dioxane, acetone, cyclohexane, cyclopentanone, isobutyl alcohol, isopropyl alcohol, tetrahydrofuran, dimethylsulfoxide, γ-butyrolactone, toluene, xylene, chlorobenzene, benzyl alcohol, isophorone, methoxymethylbutanol, ethyl lactate, propylene glycol monomethyl ether and acetate derived from propylene glycol monomethyl ether, N-methylpyrrolidone, water, or other solvents containing at least one of these solvents. A stabilizer, a dispersant, a precipitation inhibitor, a plasticizer, an antioxidant, or the like may be added to the mixture. These materials are mixed with a ball mill, an attritor, a roll mill, a kneader, a sand mill, or the like. Undispersed matter and gelled matter are removed from the resulting resin composition with a filter having a mesh which is coarser than the size of the inorganic particles, if necessary.

The resin composition is dissolved in a solvent and is then applied on a flexible insulating film or a conductive film, followed by being dried to form an adhesive layer. Preferably, the thickness of the adhesive layer is in the range of 0.5 to 100 $\mu$m. More preferably, the thickness is in the range of 2 to 25 $\mu$m. The applied resin composition is dried at 100 to 200° C. for 1 to 5 minutes, and thus an adhesive film is formed. This adhesive film is laminated with the protective film and is slit into strips with a width in the range of 35 to 158 mm. Thus, an adhesive tape used for semiconductor devices is completed. On the other hand, in order to form a metal-laminated film, the adhesive film is laminated with a metallic foil, and, if necessary, it is cured.

The resulting adhesive tape for semiconductor devices and metallic foil-laminated film are used for a semiconductor-connecting substrate, and the semiconductor-connecting substrate is used for a semiconductor device.

Methods for manufacturing an adhesive sheet for semiconductor devices, using the resin composition of the present invention and for manufacturing a semiconductor device using the adhesive sheet will now be described. The resin composition is dissolved in a solvent and is then applied on a polyester film having low peeling resistance, followed by being dried. The surface of the resin composition applied on the polyester film is laminated with a polyester or polyolefin protective film having much lower peeling resistance, thus resulting in an adhesive sheet. The resulting adhesive sheet is subjected to thermocompression to be bonded to a copper-laminated TAB tape with wiring. The other surface of the adhesive sheet is also subjected to thermocompression to be bonded to an IC and is then cured at 120 to 180° C. The IC and a wiring board are joined with each other by wire bonding and are then sealed with a resin. Finally, solder balls are formed by solder reflow, and thus a semiconductor device is completed.

According to the above, the adhesive film for semiconductor devices, the metallic foil-laminated film, the semiconductor-connecting substrate, the adhesive sheet for semiconductor devices, and the semiconductor device can be formed.

EXAMPLES

The present invention is further illustrated with reference to examples, but it is not limited to the examples. First, a method for evaluating the resin composition will be described.

Evaluation
1. Adhesion Strength

An electrolytic copper foil with a thickness of 18 μm was laminated at 130° C. and 0.1 MPa onto a 35-mm wide sample tape with the resin composition serving as an adhesive. Next, heat treatments were performed in an air oven at 80° C. for 3 hours, at 100° C. for 5 hours, and at 160° C. for 5 hours, in that order, to form a copper foil-laminated film. Copper wiring of 2 mm in width was patterned on the copper foil-laminated film by copper etching, and the tensile strength of the copper foil-laminated film was measured. The measurement of the tensile strength (N/m) was performed at a tensile rate of 50 mm/min and at 900 with a tensile strength testing machine, "Tensilon" UTM-4-100 manufactured by Orientech to estimate the adhesion strength of the resin composition.

2. Heat Resistance at Soldering

An electrolytic copper foil with a thickness of 18 μm was laminated at 130° C. and 0.1 MPa onto a 35-mm wide sample tape with the resin composition serving as an adhesive. Next, heat treatments were performed in an air oven at 80° C. for 3 hours, at 100° C. for 5 hours, and at 160° C. for 5 hours, in that order, to form a copper foil-laminated film. The copper foil-laminated film was cut into a 30 mm square. After being conditioned in an atmosphere at 80° C. and 85% RH for 48 hours, the copper foil-laminated film was immediately floated on a solder bath for 60 seconds such that the copper-foil face was upturned. Thus, the maximum temperature of the solder bath at which swelling and peeling were not exhibited was determined.

3. Thermal Expansion Coefficient

Only the resin composition serving as the adhesive was formed into a layer having a predetermined thickness with laminator, and then heat treatments were performed in an air oven at 80° C. for 3 hours, at 100° C. for 5 hours, and at 160° C. for 5 hours, in that order, to cure the adhesive layer. The resin composition was cut into a predetermined shape, and then the thermal expansion coefficient of the resin composition was measured. Using a thermal analyzer, TMA/SS6000 manufactured by Seiko Instruments, thermal expansion of the resin composition was measured at temperatures in the range of 30 to 160° C. at a heating rate of 5° C./min with reference to the length of a sample resin composition at 30° C., and thus the mean thermal expansion coefficient (ppm/° C.) at temperatures in the range of 30 to 160° C. was determined.

4. Elastic Modulus

Only the resin composition serving as the adhesive was formed into a layer having a predetermined thickness with a laminator, and then heat treatments were performed in an air oven at 80° C. for 3 hours, at 100° C. for 5 hours, and at 160° C. for 5 hours, in that order, to cure the adhesive layer. The resin composition was cut into a predetermined shape, and then the elastic modulus of the resin composition was measured. The measurement was performed with DMS 6100 manufactured by Seiko Instruments at an oscillation frequency of 1 Hz at temperatures in the range of room temperature to 260° C. at a heating rate of 5° C./min.

5. TEM Observation

Only the resin composition serving as the adhesive was formed into a layer, and then heat treatments were performed in an air oven at 80° C. for 3 hours, at 100° C. for 5 hours, and at 160° C. for 5 hours, in that order, to cure the adhesive layer. The phase separation structure in the adhesive layer was observed by transmission electron microscopy (TEM), and the area ratio of the matrix phase to the disperse phases, the shapes and sizes of the dispersion phases, and the disperse state of the inorganic particles were determined. In order to determine the area ratio of the matrix phase to the disperse phases, a polyethylene terephthalate film ("Lumirror" manufactured by Toray) having a thickness of 25 μm was superposed on the TEM photograph of 15 cm square taken at a magnification of 10000 times, and the areas corresponding to the matrix phase and the disperse phases were cut out and were each weighed. The measurement of the area ratio was performed three times and the mean area ratio was calculated.

Reference Example (Polyamide Resin Synthesis)

Using a dimer acid, PRIPOL 1009 produced by Unichema, and adipic acid as acids, acid and amine reactants are prepared such that the acid/amine ratio is about 1, and an antifoaming agent and 1% or less of phosphate catalyst were added to prepare an interactant. The interactant was heated at 140° C. for 1 hour, subsequently heated to 205° C., and was stirred for 1.5 hours. The interactant was left in 2 kPa of vacuum for 0.5 hours to cool down. Finally, an antioxidant was added, and thus a polyamide resin having a weight-average molecular weight of 20000 and an acid number of 10 was obtained.

Example 1

Preparing Inorganic Particle Slurry

Using "Aerosil" OX-50, which has a mean primary particle size of 40 nm, produced by Nippon Aerosil as spherical inorganic particles, 1 kg of silica slurry was prepared.

The constituents of the silica slurry were 90 parts by weight of the inorganic particles, that is, "Aerosil" OX-50, 10 parts by weight of the polyamide of the Reference Example, 350 parts by weight of benzyl alcohol, and 350 parts by weight of isopropyl alcohol.

The liquid mixture of these materials was stirred at 1000 rpm for 30 minutes with a homogenizer to preliminarily disperse the inorganic particles, and was subsequently stirred with DYNO-MILL type KDL A manufactured by Willy A. Bachofen with 85% of zirconia beads having a diameter of 0.3 mm with respect to the capacity of the mill at a disk rotation of 3000 rpm at a flow rate of 400 mL/min for 1 hour to mainly disperse the inorganic particles. Thus, a silica slurry (a) was prepared.

Preparing Adhesive Tape for Semiconductor Devices

The polyamide resin of the Reference Example 1, which is a thermoplastic resin, HP 4032 produced by Dainihon Ink Chem, which is a epoxy resin, and "Shonol" BKS-316 and "Shonol" CKM-908 produced by Showa Highpolymer, which are phenol resins, and the silica slurry (a) were mixed according the composition shown in Tables 1 and 2. The mixture was dissolved in a mixed solvent containing isopropyl alcohol, benzyl alcohol, and monochlorobenzene at 30° C., and thus an adhesive solution was prepared. The adhesive solution was applied at a thickness of 12 μm on the polyethylene terephthalate film "Lumirror" having a thickness of 25 μm and was dried at 100° C. for 1 minute and at 160° C. for 2 minutes to be formed into an adhesive sheet. The adhesive sheet was laminated on a 75-μm thick polyimide film "Upilex" 75S produced by Ube Industries at 120° C. and 0.1 MPa, thus resulting in an adhesive tape for semiconductor devices. The adhesive tape was evaluated in accordance with the method described above, and the results are shown in Table 1.

According to the TEM observation, the area ratio of the matrix phase to the disperse phases was 70/30 and the inorganic particles were present in the interfaces between the matrix phase and the disperse phases. The disperse phases had a higher order chain structure, as shown in FIG. 1.

Example 2

A resin composition and an adhesive tape for semiconductor devices were prepared as in Example 1 except that the silica slurry (a) was dispersed for 3 hours instead of 1 hour.

Figure 2:
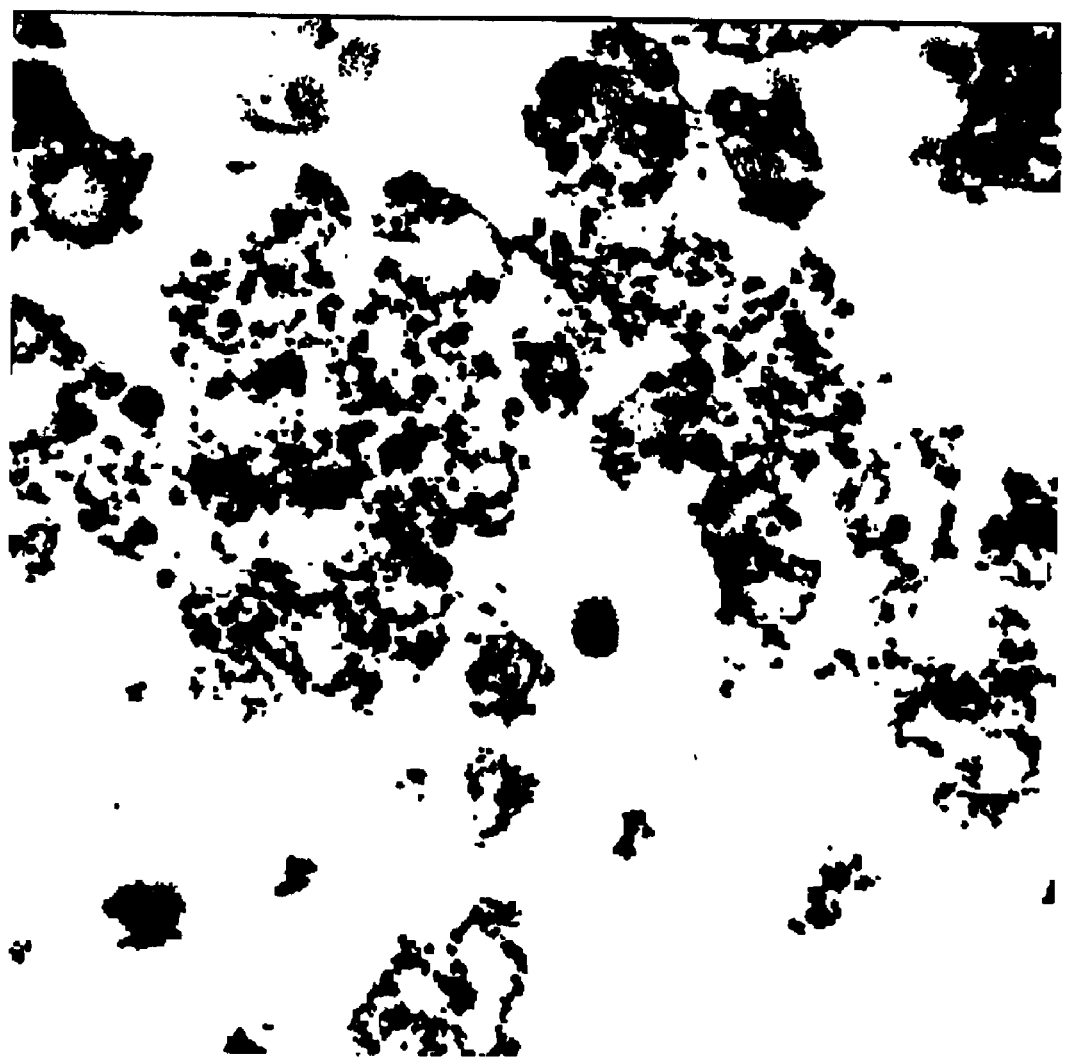

The results are shown in Table. 1. According to the TEM observation, the area ratio of the matrix phase to the disperse phases was 70/30 and the inorganic particles were concentrated in the interfaces between the matrix phase and the disperse phases. The disperse phases had a higher order chain structure due to the inorganic particles, as shown in FIG. 2.

Example 3

Preparing Inorganic Particle Slurry

Using "Aerosil" OX-50, which has a mean primary particle size of 40 nm, produced by Nippon Aerosil as spherical inorganic particles, 1 kg of silica slurry was prepared.

The constituents of the silica slurry were 90 parts by weight of the inorganic particles, that is, "Aerosil" OX-50, 10 parts by weight of HP 4032 produced by Dainihon Ink Chem., and 700 parts by weight of benzyl alcohol.

Using the liquid mixture of these materials, a silica slurry (b) was prepared as in Example 1 except that the inorganic particles were dispersed for 3 hours instead of 1 hour.

Preparing Adhesive Tape for Semiconductor Devices

The polyamide resin of the Reference Example 1, which is a thermoplastic resin, HP 4032 produced by Dainihon Ink Chem, which is a epoxy resin, and "Shonol" BKS-316 and "Shonol" CKM-908 produced by Showa Highpolymer, which are phenol resins, and the silica slurry (b) were mixed according to the composition shown in Tables 1 and 2. Then, a resin composition and an adhesive tape for semiconductor devices were prepared as in Example 1. The results of the evaluation for the resulting tape are shown in Table 1.

According to the TEM observation, the area ratio of the matrix phase to the disperse phases was 65/35 and the inorganic particles were present in the disperse phases and the vicinity of the disperse phases. The disperse phases had a higher order chain structure.

Example 4

A resin composition and an adhesive tape for semiconductor devices were prepared as in Example 2 except that "Aerosil" 90G, which has a mean primary particle size of 20 nm, produced by Nippon Aerosil was used as spherical inorganic particles.

Figure 3:
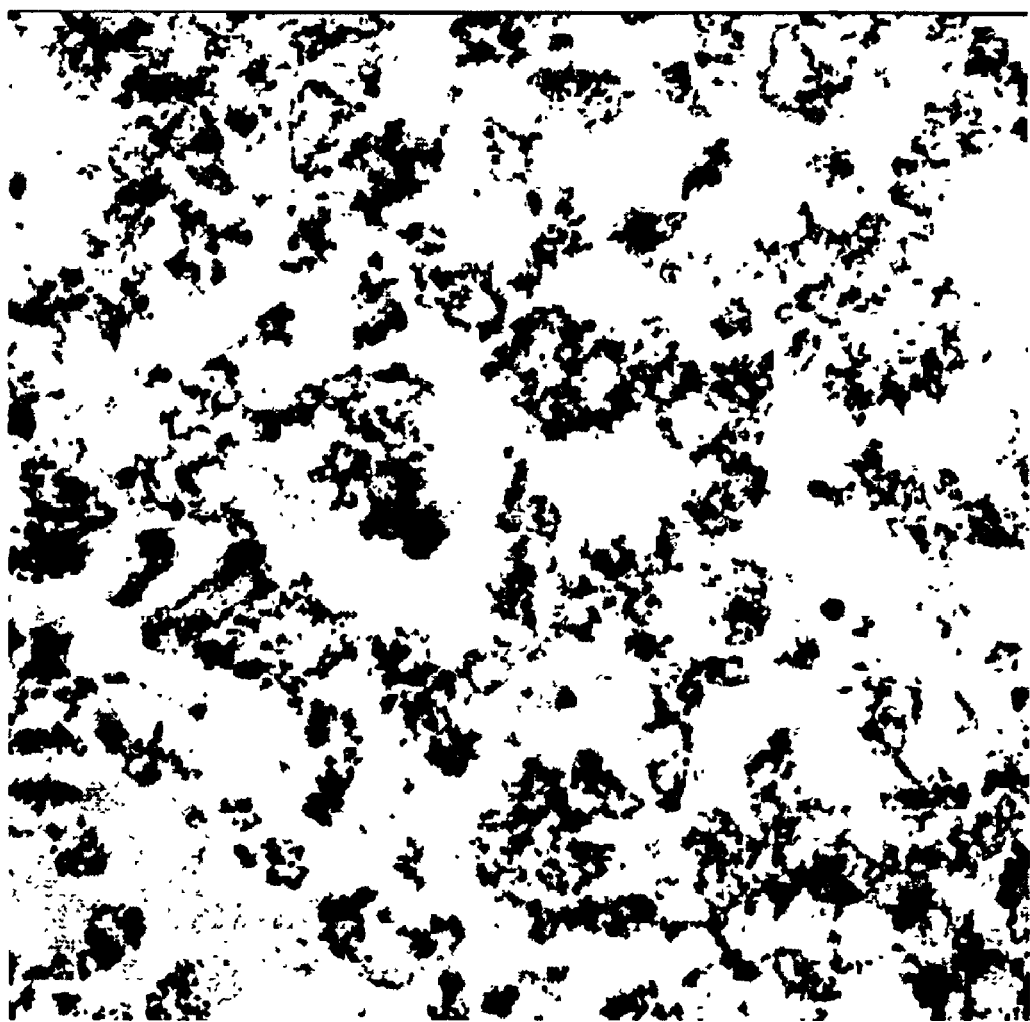

According to the TEM observation, the area ratio of the matrix phase to the disperse phases was 70/30 and the inorganic particles were concentrated in the interfaces between the matrix phase and the disperse phases. The disperse phases had a higher order chain structure due to the inorganic particles, as shown in FIG. 3.

Examples 5 and 6

Resin compositions and adhesive tapes for semiconductor devices were prepared using "Aerosil" 90G, which was used in Example 4 and has a mean primary particle size of 20 nm, as spherical inorganic particles, according to Table 1. The area ratios of the matrix phase to the disperse phases were each 70/30 and the inorganic particles were concentrated in the interfaces between the matrix phase and the disperse phases. The disperse phases had a higher order chain structure due to the inorganic particles.

Example 7

A resin composition and an adhesive tape for semiconductor devices were prepared as in Example 2 except that "Aerosil" R972, which has a mean primary particle size of 16 nm, produced by Nippon Aerosil was used as spherical inorganic particles. According to the TEM observation, the area ratio of the matrix phase to the disperse phases was 65/35 and the inorganic particles were concentrated in the interfaces between the matrix phase and the disperse phases. The disperse phases had a higher order chain structure due to the inorganic particles.

Example 8

Using "Aerosil" 90G, which has a mean primary particle size of 20 nm, produced by Nippon Aerosil as spherical inorganic particles, 1 kg of silica slurry was prepared.

The constituents of the silica slurry were 90 parts by weight of the inorganic particles, that is, "Aerosil" 90G, 10 parts by weight of the curing agent HP 4032 produced by Dainihon Ink Chem., and 700 parts by weight of benzyl alcohol.

The liquid mixture of these materials was stirred at 1000 rpm for 30 minutes with a homogenizer to preliminarily disperse the inorganic particles, and was subsequently stirred with DYNO-MILL type KDL A manufactured by Willy A. Bachofen with 85% of zirconia beads having a diameter of 0.3 mm with respect to the capacity of the mill at a disk rotation of 3000 rpm at a flow rate of 400 mL/min for 3 hours to mainly disperse the inorganic particles. Thus, a silica slurry (a) was prepared. Using this silica slurry, an adhesive, that is, a resin composition was prepared so as to have the same composition as in Example 4, and an adhesive tape was prepared and evaluated as in Example 4. The results are shown in Table 1.

Figure 4:

According to the TEM observation, the area ratio of the matrix phase to the disperse phases was 70/30 and the inorganic particles were mainly present in the disperse phases and particularly in the vicinity of the interfaces between the matrix phase and the disperse phases in the disperse phases. The disperse phases formed a higher order structure in which spherical disperse phases tightly gathered to be substantially concatenated, as shown in FIG. 4.

Example 9

Using "Aerosil" OX-50, which has a mean primary particle size of 40 nm, produced by Nippon Aerosil as spherical inorganic particles, 1 kg of silica paste was prepared.

The constituents of the silica slurry were 35 parts by weight of the inorganic particles, that is, "Aerosil"OX-50, 65 parts by weight of the polyamide of the Reference Example, 200 parts by weight of benzyl alcohol.

The liquid mixture of these materials was stirred at 1000 rpm for 30 minutes with a homogenizer to preliminarily disperse the inorganic particles, and was subsequently passed through a 3-roll mill (EXACT M-80) 10 times so that the inorganic particles were dispersed. Using this silica paste, an adhesive, that is, a resin composition was prepared so as to have the same composition as in Example 1 and an adhesive tape was prepared and evaluated as in Example 1. The results are shown in Table 1.

Figure 5:
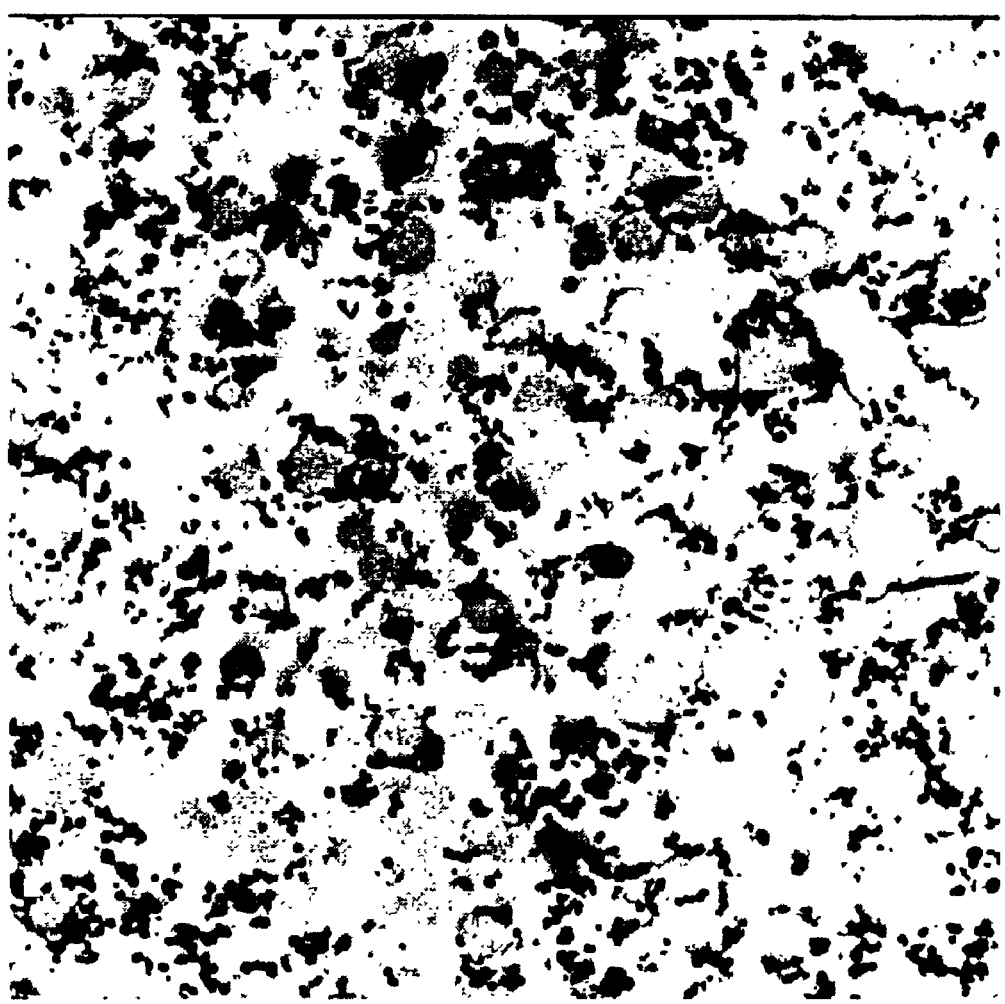

According to the TEM observation, the area ratio of the matrix phase to the disperse phases was 70/30. The inorganic particles were mainly present in the matrix phase, and the disperse phases were scattered spheres, as shown in FIG. 5.

Example 10

Preparing Adhesive Sheet

An adhesive solution containing the silica slurry prepared in Example 1 was applied on a 38 $\mu$m thick polyethylene terephthalate film with a silicone releasing agent ("Film Bina" GT produced by Fujimori Kogyo) with a bar coater so as to have a thickness of about 50 $\mu$m after being dried, and was dried at 120° C. for 5 minutes to complete an adhesive sheet of the present invention.

Preparing Semiconductor Device

An electrolytic copper foil with a thickness of 18 $\mu$m was laminated at 140° C. and 0.1 MPa onto a adhesive TAB tape,

7100 produced by Toray. Subsequently, heat treatments were performed in an air oven at 80° C. for 3 hours, at 100° C. for 5 hours, and at 150° C. for 5 hours, in that order, thus resulting in a copper foil-laminated TAB tape. The copper-foil surface of the TAB tape was subjected to formation of a photoresist layer, etching, removal of the resist, electrolytic nickel plating, electrolytic gold plating, and application of photo solder resist, as in the usual manner. Thus a patterned tape was prepared. The thicknesses of the nickel and the gold were 3 μm and 1 μm, respectively. The adhesive sheet of the present invention was laminated on the rear surface of the patterned tape at 130° C. and 0.1 MPa, and then an IC having an aluminium electrode pad was bonded on the adhesive sheet by thermocompression at 170° C. and 0.3 MPa. The IC on the adhesive sheet was subjected to heat treatment at 170° C. for 2 hours. A 25-μm long gold wire was bonded to the IC at 150° C. and 110 kHz. The IC was sealed with a liquid sealant, "Chipcoat" 8118 produced by Namics. Finally, solder balls were provided to complete a semiconductor device. The resulting semiconductor device had a high wire-bonding strength, heat cycle resistance, and solder reflow resistance.

particles were present in the matrix phase and the disperse phases did not form any higher order structure.

Comparative Example 3

A resin composition and an adhesive tape were prepared as in Example 2 except that "Admafine" SO-C1, which has a mean primary particle size of 0.2 to 0.3 μm, produced by Admatechs was used as spherical inorganic particles.

Resin compositions which did not contain inorganic particles (Comparative Example 1) and which contained inorganic particles having a large particle size (Comparative Examples 2 and 3) exhibit no higher order structure, a low elastic modulus at high temperature, a large thermal expansion coefficient, and consequently the reflow resistance was poor.

TABLE 1

|  | Example 1 | Example 2 | Example 3 | Example 4 | Example 5 | Example 6 | Example 7 | Example 8 | Example 9 | Comparative Example 1 | Comparative Example 2 | Comparative Example 3 |
|---|---|---|---|---|---|---|---|---|---|---|---|---|
| Polyamide resin of Reference Example (part by weight) | 45 | 45 | 50 | 45 | 45 | 45 | 50 | 45 | 45 | 45 | 45 | 45 |
| HP4032 (part by weight) | 15 | 15 | 15 | 15 | 15 | 15 | 15 | 15 | 15 | 15 | 15 | 15 |
| "Shonol" BKS-316 (part by weight) | 35 | 35 | 35 | 35 | 35 | 35 | 35 | 35 | 35 | 35 | 35 | 35 |
| "Shonol" CKM-908 (part by weight) | 5 | 5 | — | 5 | 5 | 5 | — | 5 | 5 | 5 | 5 | 5 |
| Inorganic particles (Type, Content/part by weight) | I 20 | I 20 | I 20 | II 20 | II 30 | II 10 | III 20 | II 20 | I 20 | — | IV 20 | IV 20 |
| Dispersing time | 1 h | 3 h | 3 | 3 h | 3 h | 3 h | 3 h | 3 h | 3 rolls | — | 1 h | 3 h |
| Adhesion strength (N/m) | 1000 | 1000 | 1000 | 1000 | 900 | 1050 | 1000 | 1000 | 1000 | 1050 | 1000 | 1000 |
| Reflow resistance temperature (° C.) | 270 | 270 | 270 | 280 | 280 | 270 | 290 | 280 | 270 | 230 | 235 | 235 |
| Elastic Modulus at 150° C. (MPa) | 60 | 75 | 75 | 100 | 180 | 30 | 90 | 100 | 45 | 6 | 18 | 20 |
| Thermal expansion coefficient (ppm/° C.) | 150 | 140 | 120 | 120 | 100 | 130 | 120 | 80 | 120 | 180 | 175 | 174 |

Comparative Example 1

Figure 6:
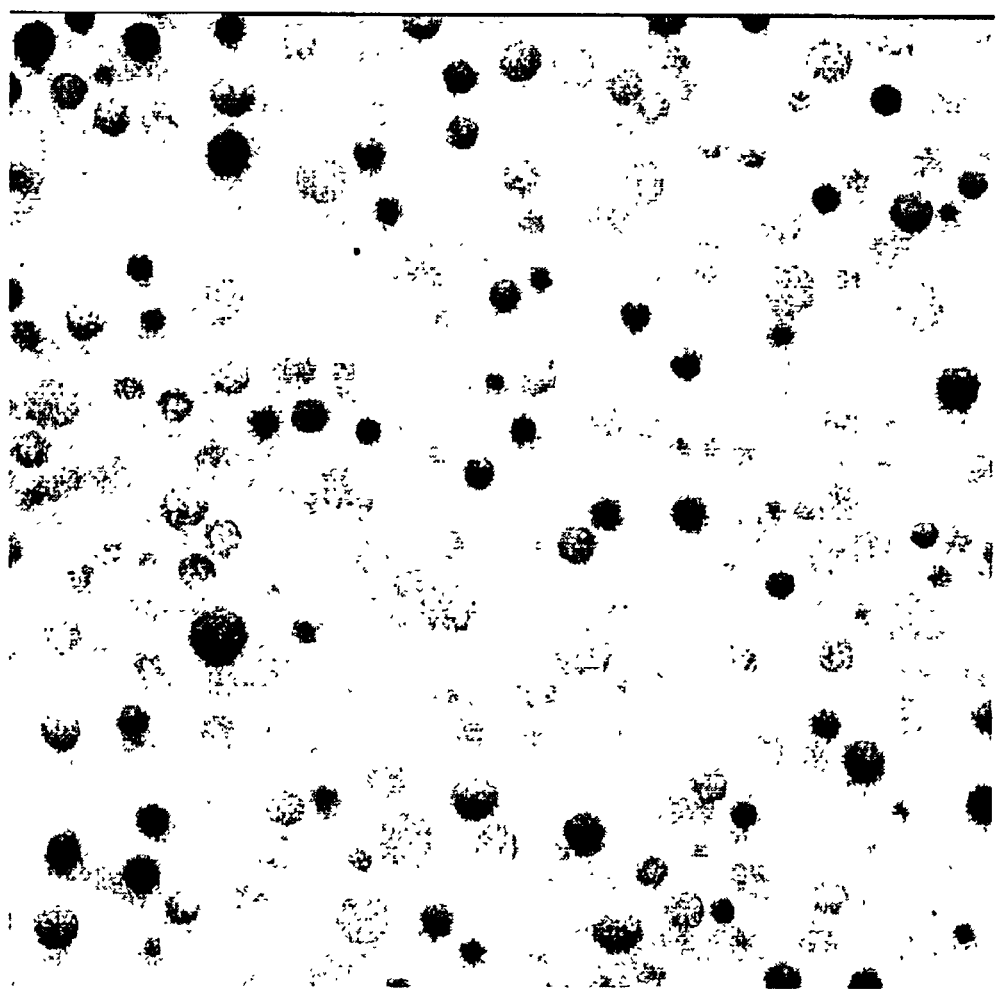

A resin composition and an adhesive tape were prepared as in Example 1 except that the inorganic particle slurry was not used. According to the TEM observation, the area ratio of the matrix phase to the disperse phases was 70/30. The disperse phases did not form any higher order structure, and spherical disperse phases were scatteringly separated, as shown in FIG. 6.

Comparative Example 2

A resin composition and an adhesive tape were prepared as in Example 1 except that "Admafine" SO-C1, which has a mean primary particle size of 0.2 to 0.3 μm, produced by Admatechs was used as spherical inorganic particles. According to the TEM observation, the area ratio of the matrix phase to the disperse phases was 70/30. The inorganic

TABLE 2

| Type of particles | Name of particles | Mean primary particle size (nm) |
|---|---|---|
| I | "Aerosil" OX-50 | 40 |
| II | "Aerosil" 90G | 20 |
| III | "Aerosil" R972 | 16 |
| IV | "Admafine" SO-C1 | 200–300 |

What is claimed is:
1. A resin composition comprising: a thermoplastic resin, a thermosetting resin, a curing agent and inorganic particles, the resin composition comprising a phase separated structure having at least a matrix phase and a disperse phase; wherein the inorganic particles have a mean primary particle size of 0.1 μm or less, and furthermore the inorganic particles are substantially present in either the matrix phase or an inter- face between the matrix phase and the disperse phase, but not present in both the matrix and disperse phases uniformly.

2. A resin composition according to claim 1, wherein the content of the inorganic particles is in a range of 5 to 50 weight percent.

3. A resin composition according to claim 1, wherein at least one of the matrix phase and the disperse phase forms a chain structure.

4. A resin composition according to claim 1, wherein an area ratio of the matrix phase is in a range of 50 to 95 and an area ratio of the disperse phase is in a range of 5 to 50.

5. A resin composition according to claim 1, wherein an elastic modulus of the resin composition after being cured is 25 MPa or more at a temperature of 150° C.

6. A resin composition according to claim 1, wherein a ratio of an elastic modulus of the resin composition at 30° C. to an elastic modulus of the resin composition at 150° C. is 30 or less.

7. A resin composition according to claim 1, wherein the inorganic particles have a mean primary particle size of 0.08 μm to 0.016 μm.

8. A resin composition according to claim 1, wherein an elastic modulus of the resin composition after being cured is in the range of 25 MPa to 180 MPa at a temperature of 150° C.

9. An adhesive film for semiconductor devices, comprising: an organic insulating layer and an adhesive layer formed on a surface of the organic insulating layer, the adhesive layer comprising the resin composition of claim 1.

10. An adhesive film according to claim 9, further comprising a removable protective layer.

11. A laminated film comprising a metallic foil and the adhesive film of claim 9; wherein the metallic foil is laminated on the adhesive layer of the adhesive film.

12. A semiconductor device comprising the laminated film of claim 11.

* * * * *